(12) United States Patent
Pascucci

(10) Patent No.: US 6,700,819 B2
(45) Date of Patent: Mar. 2, 2004

(54) MEMORY WITH IMPROVED DIFFERENTIAL READING SYSTEM

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/176,954

(22) Filed: Jun. 20, 2002

(65) Prior Publication Data

US 2003/0016572 A1 Jan. 23, 2003

(30) Foreign Application Priority Data

Jun. 21, 2001 (IT) ..................... MI2001A1311

(51) Int. Cl.[7] ............................. G11C 16/06
(52) U.S. Cl. ................. 365/185.21; 365/185.2
(58) Field of Search ............... 365/185.21, 185.2, 365/185.24, 205, 207, 208

(56) References Cited

U.S. PATENT DOCUMENTS

| | | | | |
|---|---|---|---|---|
| 4,949,307 A | * | 8/1990 | Campardo | ............. 365/201 |
| 5,218,570 A | * | 6/1993 | Pascucci et al. | ....... 365/185.21 |
| 5,258,959 A | * | 11/1993 | Dallabora et al. | ...... 365/185.21 |
| 5,386,388 A | * | 1/1995 | Atwood et al. | ......... 365/185.22 |

* cited by examiner

*Primary Examiner*—Son L. Mai
(74) *Attorney, Agent, or Firm*—Lisa K. Jorgenson; Dennis M. de Guzman; Seed IP Law Group PLLC

(57) ABSTRACT

A dynamic or non-volatile memory with a differential reading system with improved load rebalancing comprising a rebalancing circuit that for values of the supply and memory selection voltage in excess of a predetermined reference voltage modifies one or the other of two currents, i.e., the measuring current or the reference current, with an equivalent effect on the load rebalancing.

25 Claims, 6 Drawing Sheets

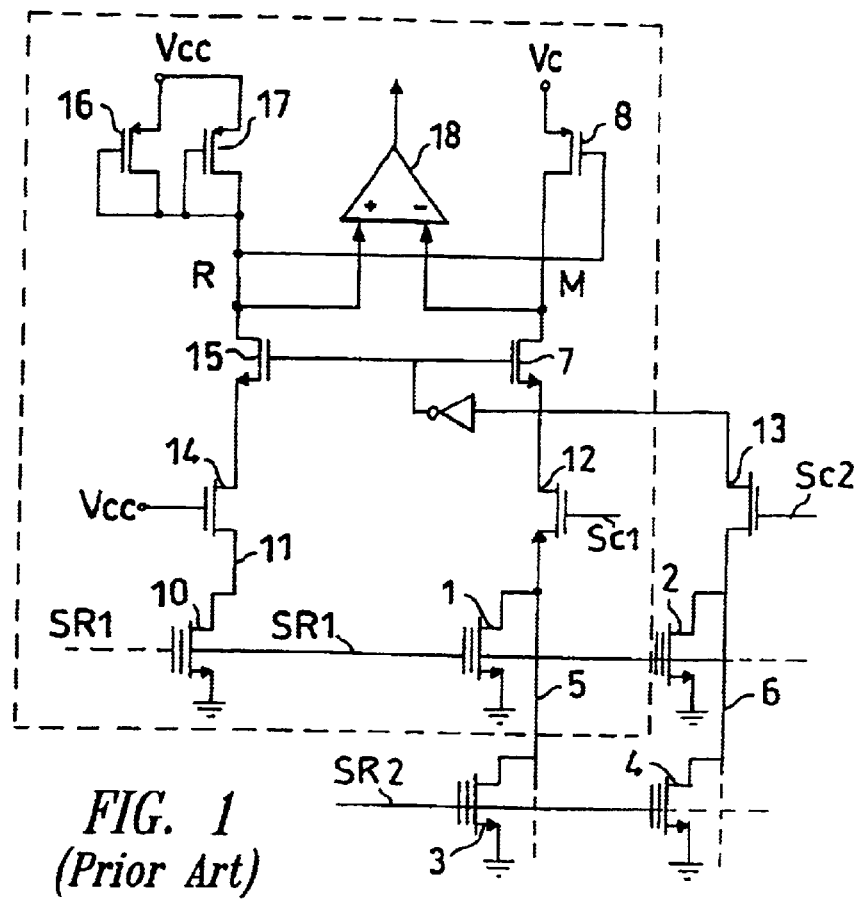
FIG. 1
*(Prior Art)*
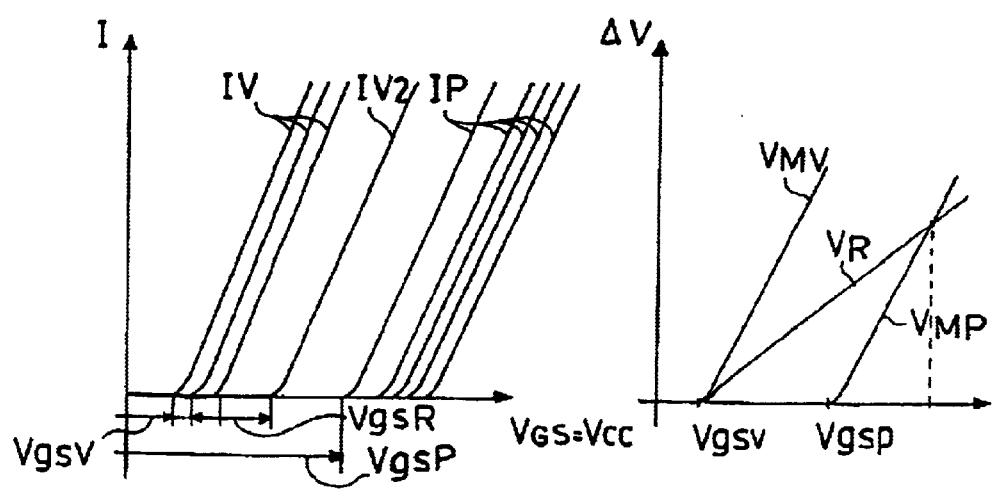
FIG. 2      FIG. 3

MEMORY WITH IMPROVED DIFFERENTIAL READING SYSTEM

BACKGROUND OF THE INVENTION

1. Field of the Invention

The present disclosure concerns non-volatile memories and, more particularly but not exclusively, non-volatile memories in which the reading of a cell and the recognition of its contents are obtained by means of comparison with the state of a reference cell.

2. Description of the Related Art

It is well known that each memory cell of a non-volatile memory comprises essentially of a field-effect P- or N-channel (preferably N-channel) transistor that is provided not only with a control and selection gate, but also with an insulated gate, the so-called floating gate, by means of which it is possible—using various techniques that depend on the type of memory involved—to inject electric charges that remain confined in the floating gate even for long periods of time and determine the electric behavior of the cell.

The removal of these electric charges from the floating gate can be obtained by means of various techniques that again depend on the type of memory and are not of immediate interest for our present purposes, exposure to UV rays being a case in point.

As a general rule, whenever the floating gate is in a neutral or virgin state, i.e., devoid of charges, the cell channel will not be conductive, though a modest and appropriately biased voltage Vgsv applied to the control and either wholly or partly superposed on the floating gate will be quite sufficient to make the cell conduct.

In the presence of electric charges on the floating gate, on the other hand, the transistor will be strongly biased in interdiction and a more substantial voltage Vgsp will therefore have to be applied to the control gate before it can be rendered conductive.

If it were possible to impose on the systems a working voltage that will always and securely be intermediate between Vgsv and Vgsp, it would be easy to distinguish a virgin cell from a programmed cell, because one could then advantageously observe the conduction or non-conduction state of the cell under consideration.

In practice, however, the great variability of the supply voltages of the various systems that are usually applied to the gates of the NV cells renders this approach far from reliable, because the state of conduction or non-conduction will not be preserved for supply voltages in excess of Vgsp.

Recourse has therefore been had to differential reading systems in which the reading of a memory cell is always associated with the reading of a reference cell of which the state is known and corresponds to the neutral or virgin state.

Though this approach makes it easy to recognize when a memory cell has been programmed, i.e., is in a non-neutral state, the identification of the neutral state of a memory cell remains uncertain on account of the relative similarity (apart from the inevitable dispersion of the electric behavior of the various devices) of the characteristics of the reference cell and the matrix cell under observation, both of which are virgin.

Various measures have therefore been proposed to overcome this limit, among them the current-offset differential reading system, the threshold translation system and, lastly, the one that on account of its simplicity and reliability is also the most commonly used in practice, namely the so-called unbalanced-load differential reading system.

The unbalanced-load reading system eliminates the uncertainty in recognizing the virgin state of a memory cell even at low voltages, but has the grave drawback that, given limited threshold jumps, it introduces uncertainties as regards the recognition of the programmed state of a cell when there is an increase in the supply voltage that is normally used also for cell selection.

In fact, what happens (see FIG. 3) is that at sufficiently high working voltages, given the intersection of the reference characteristic and the characteristic of the programmed cells, the system will invariably produce a wrong reading, since the programmed cell will now conduct more than the reference cell, just as in the case of a virgin cell.

In traditional NV memory circuits, where the threshold jumps between virgin cells and programmed cells are high (more than 3V), this problem will typically occur outside the working range (4–6 V) of the memory.

But there are also NV memories, the N-ROM memory being a case in point, that permit only limited threshold jumps (1.5V); consequently, they do not enjoy this advantage and therefore fail in their actual working range.

BRIEF SUMMARY OF THE INVENTION

This limitation is overcome by the non-volatile memory with the improved differential reading system in accordance with an embodiment of the present invention, where the load unbalancing method is combined with a load rebalancing method above an appropriately chosen and—in the limit— variable threshold voltage with the characteristics of the memory cells. This threshold is chosen in such a manner that, no matter how greatly the supply and control voltage of the memory cells may exceed the conductivity threshold voltage, the characteristic of the reference system, generated by a reference circuit, will always assume an intermediate value that can be clearly distinguished from the characteristic corresponding to the reading of a virgin cell or the reading of a programmed cell.

In this way, no matter what the supply voltage of the memory and its degree of ageing, the proposed system eliminates all uncertainty as regards the recognition of the neutral or programmed state of the memory cells.

BRIEF DESCRIPTION OF THE SEVERAL VIEWS OF THE DRAWING(S)

The characteristics and advantages of the invention will be brought out more clearly by the description about to be given of an embodiment and its variants, which are to be considered as examples and not limitative in any way, said description making reference to the attached drawings of which:

FIG. 1 shows the circuit diagram of a non-volatile memory with an unbalanced load reading system known to the state of the art;

FIG. 2 shows a diagram representing the current response of, respectively, virgin and programmed memory cells plotted against the variation of the selection voltage Vgs;

FIG. 3 shows a diagram representing the voltage response of the unbalanced load differential reading system of FIG. 1;

DETAILED DESCRIPTION OF THE INVENTION

Figures 4, 5:
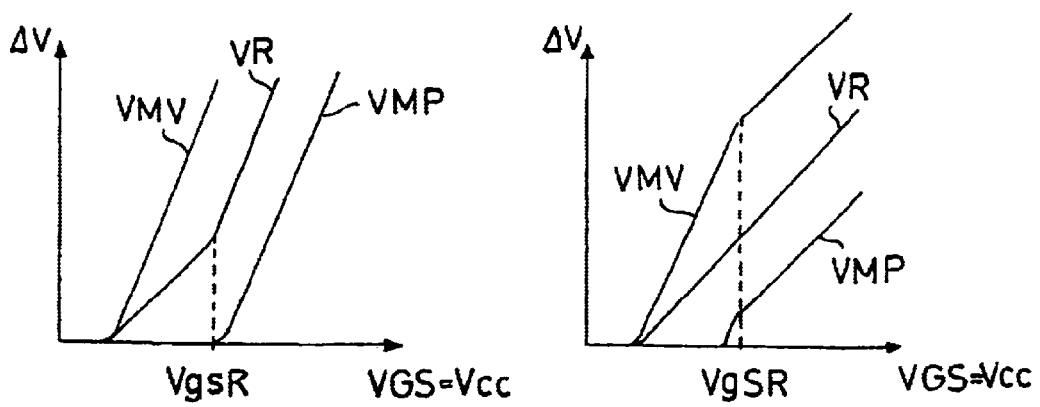
FIG. 4 shows a diagram representing the voltage response of the unbalanced load differential reading system in accordance with a first embodiment of the present invention.
FIG. 5 shows a diagram representing the voltage response of the unbalanced load differential reading system in accordance with a second embodiment of the present invention.

Embodiments of a memory with improved differential reading system are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

With a view to facilitating comprehension of the invention, it will be appropriate to begin with a brief description of a non-volatile memory with the known unbalanced load differential reading system.

Referring to FIG. 1, a memory of this type comprises a matrix of memory cells organized into rows and columns and each constituted by a transistor (an N-channel transistor in FIG. 1) with a floating gate, like 1, 2, 3, 4.

The memory cells of each column have their drain connected to a bit line 5, 6 and their source grounded.

The various bit lines are selectively connected to a supply voltage Vcc through respective transistors/selection switches 12, 13 piloted by respective column selection signals SC1, SC2 applied to a homonymous selection line and the series comprising a transistor/protection switch 7 and a measuring resistor constituted by the P-channel transistor 8 that has its gate connected to a reference line that will be described further on.

All the transistors constituting a cell row of the matrix have their gate connected to a row selection line SR1, SR2 to which there is applied a homonymous row selection signal. For the sake of simplicity, FIG. 1 shows only two rows of cells and two row selection lines SR1, SR2.

When an appropriate biasing voltage, generally Vcc, is applied to one of the various row selection lines Sri and column selection lines SCi, just a single memory cell is selected and this cell, together with the column selection transistor (12 or 13), the transistor 7 and the resistor 8, forms a measuring line in which there flows a current that in first approximation depends exclusively on whether the state of the selected memory cell is neutral or programmed. It should be recalled in this connection that when an MOS device operates in saturation, the current that flows in the device is in first approximation independent of the load resistance and the voltage Vcc and depends only on the voltage Vgs and the threshold voltage Vt.

More precisely, we have:

$$Id=k[Vgs-Vt]Vds-Vds^2/2 \quad (1)$$

for a virgin cell (Vgsv=Vt)

$$Id=k[Vgs-(Vt+Vts)]Vds-Vds^2/2 \quad (2)$$

for a programmed cell (Vgsp=Vt+Vts)

By comparison with a reference voltage, the voltage drop across the resistor 8 and therefore the voltage at the node M provides an indication of the neutral (logic 1) or programmed (logic 0) state of the selected cell.

The reference voltage is obtained by means of a reference line 11 to which there is connected the drain of a floating-gate transistor 10 that has its source grounded.

Line 11 is connected to the supply voltage Vcc via the series of two transistors 14, 15 (which balance the load of the column selection transistor 12 or 13 and the protection transistor 7 on the measuring line) and a load constituted by two measuring transistors 16, 17 connected in parallel with each other, these transistors being identical with the transistor 8 of the measuring line and similarly connected.

The transistor 10 has its floating gate in a neutral state and its control gate biased by the voltage Vcc (or by the OR of row selection signals SRi).

Similarly, the transistor 14 has its gate biased by the voltage Vcc (or in an equivalent manner by the OR of the column selection signals SCi).

The reference line is therefore wholly similar to the measuring line, but with two fundamental differences: the transistor 10 always has its gate in a neutral or virgin state, while the corresponding memory cell selected in the measuring line can have its floating gate in either a neutral state or a programmed state.

Given the dimensional identity of the transistors 16, 17 with the transistor 8, the measuring or load resistance of the reference line is equal to half the resistance of the measuring line.

As a general rule, therefore, the voltage applied to the node R between the drain of the transistors 16, 17 and the drain of the transistor 15 will thus be different from the voltage of node M and determined by the aforesaid two differences between the two lines. This voltage, together with the one at the node M, is applied as input to a differential comparator 18 to decide the state of the selected memory cell in the measuring line.

FIG. 2 is a diagram that represents the current response of the memory cells as a function of their state (virgin or programmed) and the selection stimulus (voltage Vgs applied between gate and source and generally equal to the supply voltage Vcc). The line bundle $I_V$, of which the lines are practically straight and parallel except at the beginning (in conformity with equation (1)), represents the behavior of the virgin cell, while the line bundle $I_P$, the lines of which are practically straight (except at the beginning) and parallel to the lines in the other bundle (in conformity with equation (2)), represents the behavior of the programmed cells.

The diagram of FIG. 3, which represents the response of the differential reading system of FIG. 1, can be obtained directly form the diagram of FIG. 2.

The ordinate of this diagram represents the voltage drop AV across the measuring transistors/resistors 8, 17 and therefore the voltage at the nodes R and M referred to the voltage Vcc rather than to ground.

The lines VMV and VMP represent respectively the voltage at the node M according to whether the read cell is virgin or programmed.

The line VR represents the voltage at the node R: it is obvious that the slope of this line is equal to half that of the lines VMV and VMP, because the current that flows in each of the transistors/resistors 16 and 17 is equal to half the current that flows in the reference cell 10.

The state of the memory cell can therefore be readily discriminated even in the presence of behavior dispersions with biasing voltages Vgs that are only slightly greater than the threshold value Vgsv and up to a value VgsMax slightly greater than the threshold value Vgsp. Above this value, however, the comparator would provide a wrong response, because the line VR, which represents the reference voltage, crosses the bundle of lines that—for the sake of simplicity—is here represented solely by the line VMP.

It is therefore evident that the possibilities of employing this circuit in a range of supply voltages Vcc (and therefore of selection voltages Vgs) are greatly limited at the higher voltages and that this limitation becomes more marked as the threshold jump becomes smaller.

This grave drawback is overcome by the measuring system in accordance with the present invention, which lends itself to various embodiments that are all based on the same concept: the rebalancing of the loads.

Turning back to FIG. 3, indeed, it is clear that the smaller slope of line VR as compared with the others is due solely to the unbalancing of the resistive loads from which the voltage drop is obtained.

In fact, the reference load (transistors 16, 17 of FIG. 1) is half the measuring load (transistor 8 of FIG. 1).

However, this unbalancing can also be looked at from a current point of view: if we consider the transistors 17 and 8 as resistors of the same value—as in fact they are—that convert a measuring current and a reference current into, respectively, a measuring voltage and a reference voltage, one notes that the smaller slope of the line VR as compared with the others is due to the unbalancing of the current loads that pass through the two resistors: in fact, due to the presence of the transistor/resistor 16 in parallel with transistor 17, the current passing through the transistor/resistor 17 is half the current that flows in the reference circuit.

The crossover of the characteristics at high voltages Vgs can therefore be avoided if the current loads are rebalanced by starting from a predetermined interrogation/selection voltage VgsR.

This result can be obtained in two ways that are illustrated, respectively, by FIGS. 4 and 5:
  1) by doubling the load current increments in the measuring line when the voltage Vgs increases beyond a predetermined value VgsR. As can be seen from FIG. 4, above the voltage VgsR the slope of the line VR thus becomes equal to the slope of the lines VMV and VMP, so that there will no longer be a crossover.
  2) by halving the current load increments in the measuring line when the voltage Vgs increases above a predetermined value VgsR. In that case, as shown by FIG. 5, above the voltage VgsR the slope of the lines VMV and VMP becomes equal to that of the line VR and the characteristics will no longer intersect.

There are several embodiments with which this result can be obtained.

Figure 6:
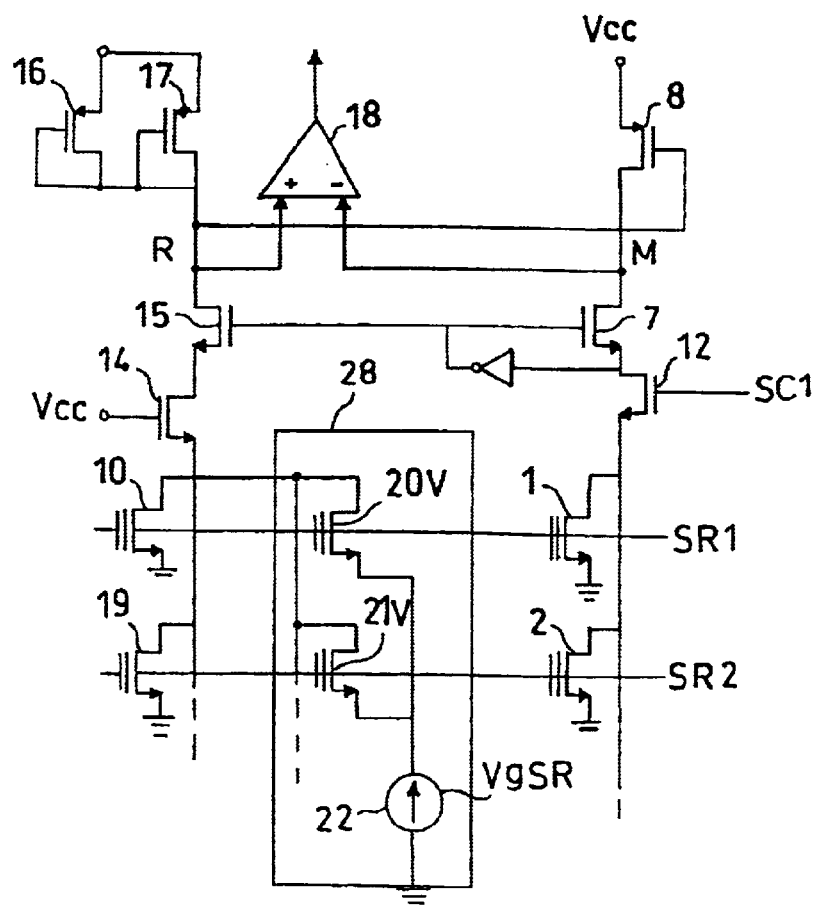
FIG. 6 shows the circuit diagram of a non-volatile memory with the unbalanced and rebalanced load differential reading system in accordance with a first embodiment of the present invention.

FIG. 6 shows the simplest and first embodiment, which employs the first of the aforesaid rebalancing methods.

Since many of the circuit components are functionally equivalent to those of FIG. 1, they are also indicated by the same reference numbers in FIG. 6 and in further figures.

Over and above the previously illustrated components, the differential measuring system of FIG. 6 comprises in addition to the reference cell 10 at least one other reference cell 20 that has its floating gate in the neutral state, its drain connected to the drain of cell 10 and its source connected to a reference voltage source 22 that provides a positive reference voltage VgsR.

As shown in the figure, both the cell 10 and the cell 20V are repeated as many times as the number of memory cells that make up a memory column or bit line and each repetition, like 19 and 21V, has its gate piloted by a corresponding row selection line SR1, SR2.

In other words, rather than having just a single reference cell 10 piloted by the OR of the various selection signals, the circuit now has an array of parallel reference cells, each piloted by a corresponding row selection signal and, further, for each reference cell like 10, 19 the circuit now comprises a corresponding rebalancing cell 20, 21V piloted by the same selection signal, i.e., respectively SR1, SR2, and with its source connected to the voltage source 22.

It should be noted that the applied selection signal passes from the electric value 0 to the value Vgs with a transitory of which the dynamic characteristic is therefore advantageously the same for all the selected cells, so that the differential reading is particularly rapid and there are no waiting times while the signals to be compared are being set up, the evolution of these signals being simultaneous without giving rise to uncertainties.

Advantageously the rebalancing cells 20V, 21V are in a neutral or virgin states, i.e., these cells are not programmed and their electrical behavior is therefore as illustrated by diagram IV of FIG. 2.

Nevertheless, since their source is connected to the reference voltage source VgsR, which is advantageously different from GND, they begin to conduct only when the biasing voltage of the gate Vgs becomes equal to VgsR+Vgsv.

Their electrical characteristic in the diagram of FIG. 2 is therefore shifted along the abscissa by the quantity VgsR and becomes represented by IV2.

It is therefore obvious that at voltages Vgs=Vcc in excess of VgsR+Vgsv, a selected rebalancing cell like 20V and 21V will make a current contribution to the measurement line equal to the corresponding increment of the current passing through the selected reference cell 10 or 12. This means that the variation in the voltage drop across the load transistors 16, 17 will now be twice as great as the variation that would occur in the absence of the rebalancing cell. In other words, the reference voltage applied to the node R will now behave as shown in the diagram of FIG. 4.

As well known to persons skilled in the art, the reference voltage generator 22 of FIG. 6 can be realized in many different ways.

Figure 7:
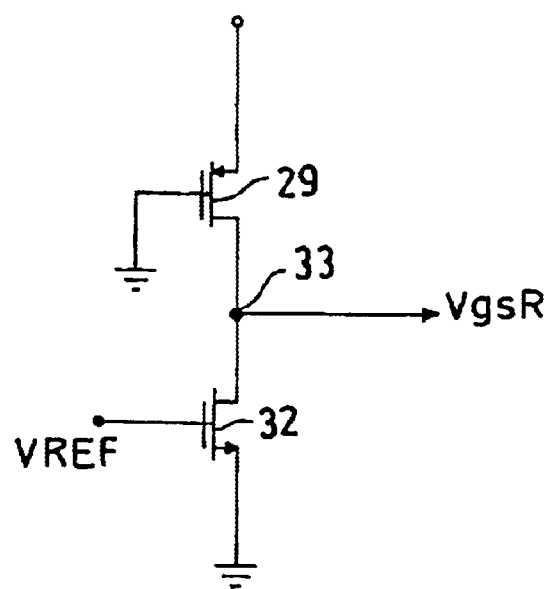
FIG. 7 shows the circuit diagram of a reference voltage generator for the reading system of FIG. 6.

As shown in FIG. 7, for example, it may be constituted by the combination of a P-channel transistor 29 and an N-channel transistor appropriately biased by a voltage Vref that, in its turn, is obtained by means of a conventional reference circuit known as a band-gap circuit (within or without the integrated circuit that constitutes the memory).

The voltage Vref may be formulated either as a fixed or a variable voltage according to the particular requirements: it is well known, in fact, that the threshold jump between virgin cells and programmed cells tends to become smaller as the memory device ages and the number of writing/cancellation cycles increases.

It is therefore advantageous in one embodiment to dispose of a voltage that can vary with the life of the device in order to obtain a reference characteristic that, independently of the age of the device, will be duly centered between the respective characteristics of the virgin cells and the programmed cells.

The transistor 29 has its source connected to the supply voltage Vcc, its gate connected to ground and its drain connected to an output node 33, and the value of its resistance may be rendered variable as required.

The transistor 29 functions as a current limiter resistor. A voltage that can be modulated according to need is available at the node 33.

Figure 8:
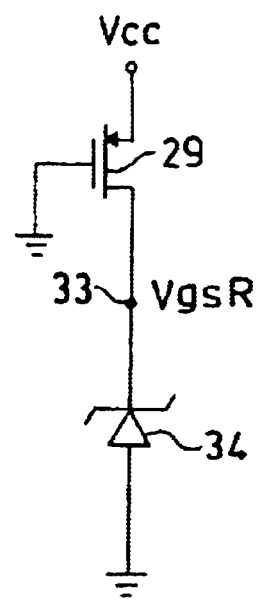
FIG. 8 shows a variant of the circuit diagram of FIG. 7.

Alternatively, as shown in FIG. 8, the transistor 32 may be replaced by a Zener diode, though in this case it will not be possible to modulate the reference voltage.

Taken together, the cells 20V, 21V and the voltage source 22 constitute a current rebalancing circuit (block 28) that employs floating-gate cells in a neutral or virgin state.

However (albeit at the expense of greater complications in the process of verifying the writing operation, when this is performed), the circuit can be simplified and rendered more in keeping with the electrical behavior of the memory cells, which varies in time with the number of writing and cancellation cycles and the manner in which the writing is effected (applied voltage level).

Referring to FIGS. 4 and 5, it may be noted that, no matter what the slope of the curves VMV and VMP, the voltage VgsR, i.e., the voltage above which it is desirable to commence the rebalancing of the reading system, is always within the range of variability of the threshold voltage Vgsp of a programmed cell.

Figure 9:
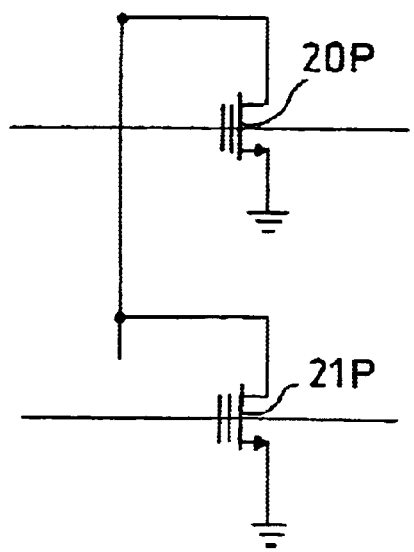
FIG. 9 shows yet another variant of the rebalancing circuits of FIG. 6.

It is therefore possible to substitute the block 28 of FIG. 6 with the circuit shown in FIG. 9, in which the cells like 20V, 21V of FIG. 6 are replaced by cells that are programmed with modest and appropriate charges, like the cells 20P and 21P.

It is evident that these cells will start conducting at a voltage VgsR=Vgsp and, if the cells are written and cancelled with the same modalities as are used for the memory cells, their electrical behavior in the course of time will be exactly the same as these cells, though with minimal dispersions.

Figure 11:
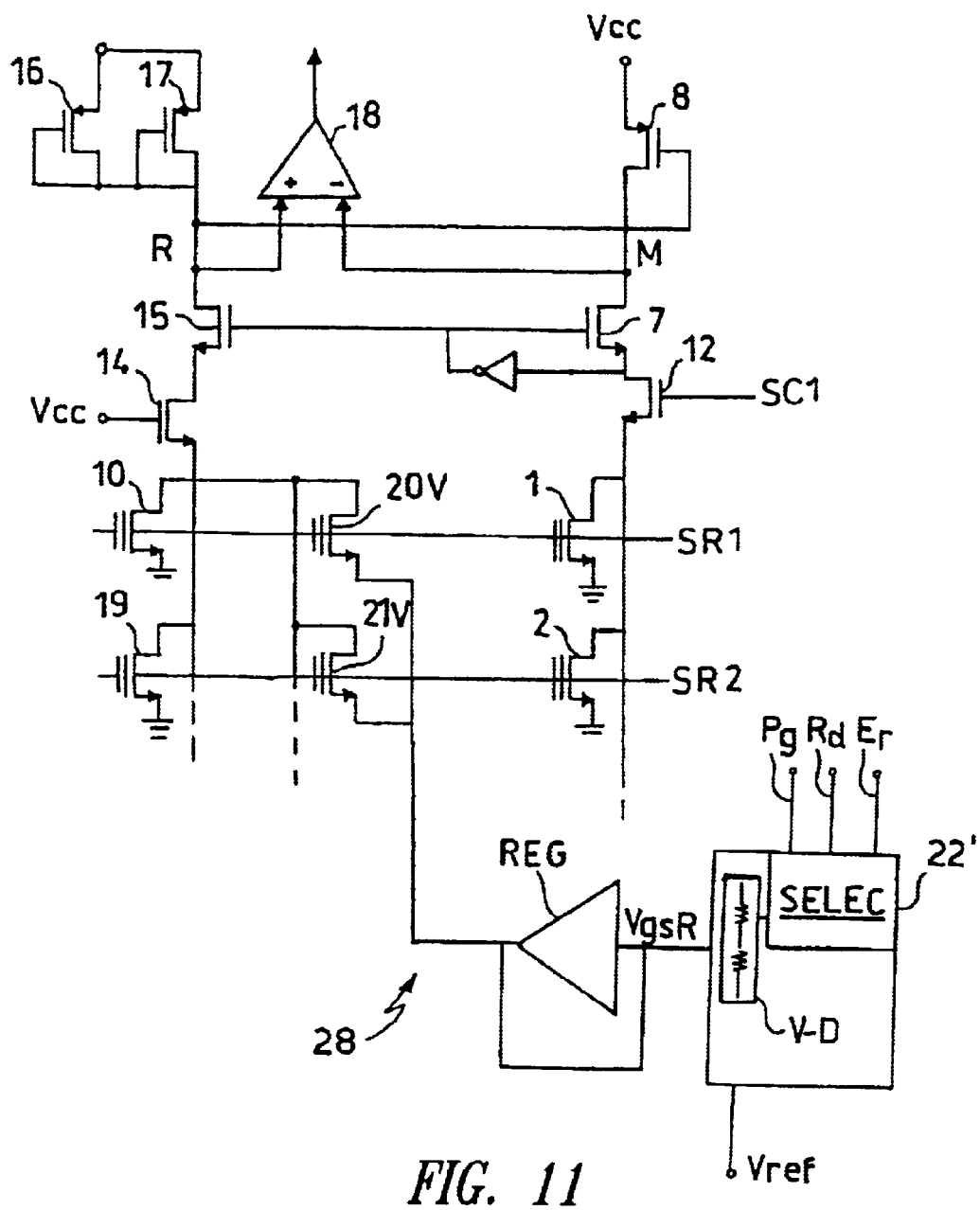
FIG. 11 shows a further variant of the rebalancing circuit of FIG. 6.

A further embodiment of a system similar to that of FIG. 6 and therefore of the type of the first rebalancing method is shown in FIG. 11.

The memory system of FIG. 11 makes it possible to improve the reading reliability not only within the ambit of a reading operation in the proper sense of the term (i.e., intended to know the contents of the memory cell), but also for the purpose of verifying the result of a cancellation operation or a programming operation.

It should be recalled that, in accordance with the example of FIG. 6, the reference voltage VgsR imposed by the generator 22 has its counterpart in a behavior of the current in the rebalancing cells 20V and 21V illustrated, for example, by the curve Iv2 of FIG. 2. The curve Iv2 is appropriately intermediate between the curves Iv, which represent the behavior of virgin cells, and the curves Ip, which represent the behavior of programmed cells.

In the circuit illustrated by FIG. 11 a differential output generator 22' such as to provide a voltage that can selectively assume not only a value suitable for being employed in a memory cell reading operation, but also at least one other value is, advantageously, employed.

To this other voltage there corresponds a curve of the reference current that represents a margin curve that can be employed readings effected with a view to verifying the result of a programming or cancellation operation of specific memory cells.

In particular, the differential output generator 22' is such as to generate an output voltage VgsR that can selectively assume a first voltage value VgsR-Rd, a second voltage value VgsR-Er or a third voltage value VgsR-Pg.

The value assumed by the voltage output VgsR of the generator 22' can be selected by means of control signals that are applied to said generator. In greater detail, the generator 22' comprises appropriate terminals for receiving a first control signal Rd, a second control signal Er and a third control signal Pg such as to select, respectively, the first value VgsR-Rd, the second value VgsR-Er and the third value VgsR-Pg of the output voltage of the generator.

The differential output generator 22' can be realized—in manner that is obvious to a person skilled in the art—on the basis of the present description. For example, this generator may comprise a conventional resistive voltage divider V-D to which there is applied the voltage Vref obtained from a band-gap circuit, and a selection circuit SEL (for example, comprising transistors that can be activated and deactivated, ie., rendered conductive or non-conductive) intended to select the specific output voltage on the basis of the control signals.

Alternatively, the specific voltage to be selected among the three values VgsR-Rd, VgsR-Er and VgsR-Pg can be obtained by means of appropriate programming of the memory cells.

Advantageously in one embodiment, a conventional voltage regulator REG intended to stabilize the output voltage VgsR produced by the generator may be interposed between the differential output voltage generator 22' and the source of the reference cells 20V and 21V.

Figure 12A:
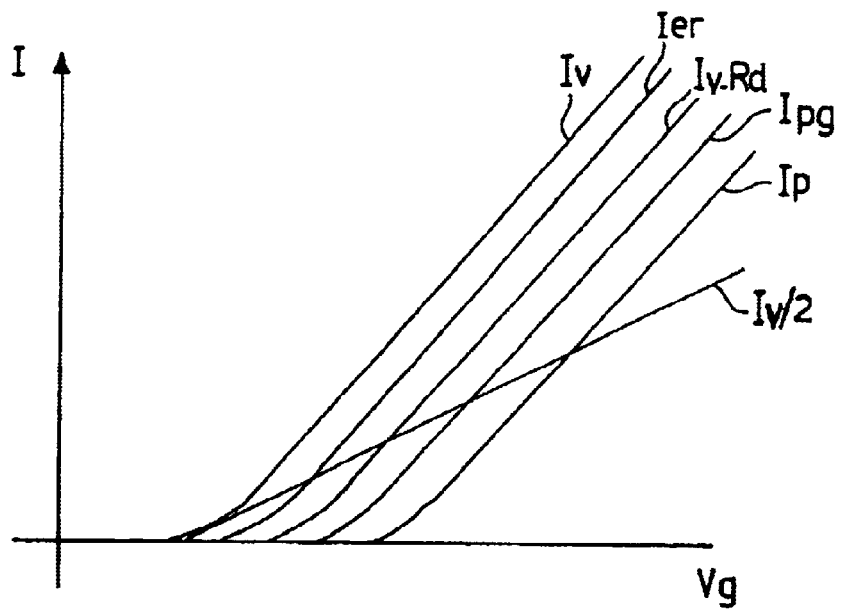
FIG. 12a shows the behavior of the currents of the rebalancing cells of FIG. 11.

FIG. 12a reproduces a diagram that shows the behaviors of the currents of the rebalancing cells when the aforesaid voltages are applied to their respective sources. The curve Ier, Iv-Rd and Ipg refer, respectively, to the voltages VgsR-Er, VgsR-Rd, VgsR-Pg. As already mentioned in connection with FIG. 2, the curves Iv and Ip represent, respectively, the behaviors of the current of the virgin cells (Iv) and the programmed cells (Ip). FIG. 12a also shows a curve Iv/2 that represent the behavior of the reference current when there is no rebalancing. As can be seen from this figure, this curve intersects the curve Ip.

Figure 12B:
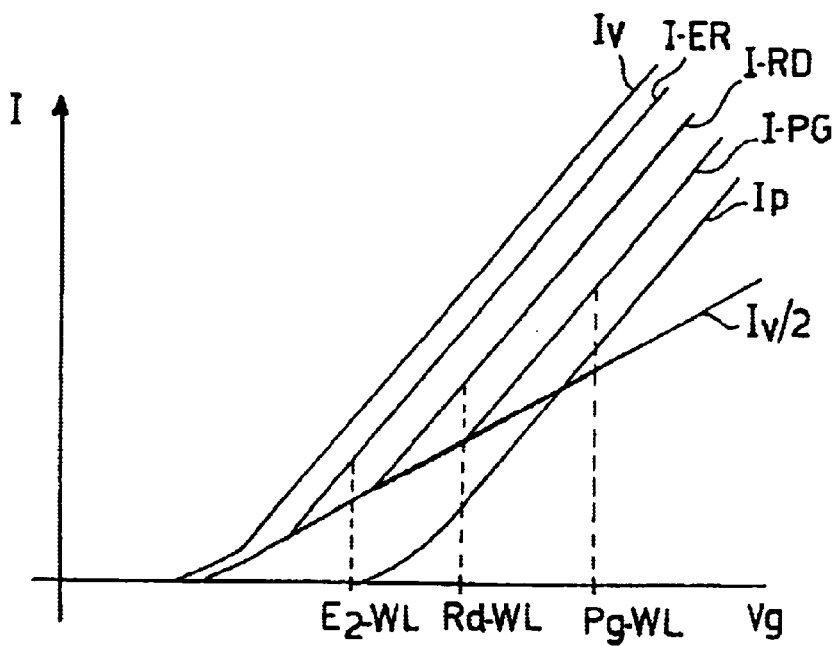
FIG. 12b shows the behavior of the reference currents of the circuit of FIG. 11.

FIG. 12b shows a diagram that represents the behaviors of the reference currents (that come into being when rebalancing is used) corresponding to the different voltage values applied by the differential output voltage generator 22'.

In greater detail, the diagram of FIG. 12b shows the curves I-RD, I-ER, I-PG representing the behaviors of the reference current (which governs the voltage at the node R) that becomes established in the memory system upon the application of, respectively, the first voltage value VgsR-RD, the second voltage value VgsR-Er and the third voltage value VgsR-Pg.

Each of these curves I-RD, I-ER, I-PG is obtained from the sum of the curve Iv and, respectively, the curves Iv-Rd, Ier, and Ipg, multiplying the result by the factor ½. The curve I-ER is a curve to which reference is made when verifying that a memory cell has effectively been cancelled. As clear for the skilled person, to the curve I-ER corresponds another curve that expresses the behavior of the voltage response of the differential system and that is of a type similar to the curve shown in FIG. 3, so that it is here omitted for clarity of description.

In the course of a memory cancellation operation (during which appropriate electric pulses are sent to the cells) it will be advantageous not to consider the curve I-RD as the reference curve when checking that a cancellation has been made, but rather to make reference to the curve I-PR, which is closer to the curve Iv characteristic of virgin cells.

When reference is made to the curve I-ER, a reliability margin is introduced into the reading (as compared with the use of curve I-RD) and this makes it possible to avoid that in the presence of non-optimal conditions (particular values of temperature or humidity, for example) the differential comparator 28 may come to indicate a cancellation as made even though it has not yet been effected.

Similarly, when in the course of a programming operation of the memory cells it is desired to check the completion of the operation, it will be advantageous not to consider the curve I-RD as the reference curve, but rather to make reference to the curve I-PG, which is closer to the curve Ip characteristic of programmed cells.

In this case, once again, reference to the curve I-PG introduces (as compared with curve I-RD) a reliability margin that makes it possible to avoid erroneous indications of effective programming completion.

Furthermore, it can also be arranged that when readings carried out during a cancellation, a reading in the proper sense or a programming, there is used either a single value of the row voltage (SR1, SR2) or three distinct values. As shown by way of example in FIG. 12b, a row voltage Er-WL can be used for a cancellation operation (amounting to 3V, for example), or a somewhat higher voltage Rd-WL (amounting to 4V, for example) for a reading in the proper sense of the term. An even higher voltage Pg-WL (equal to 5V, for example) can then be used for a programming operation.

Whenever a single value of the row voltage is used for all three operations, this value could be equal to the intermediate value Rd-WL indicated above.

Figure 10:
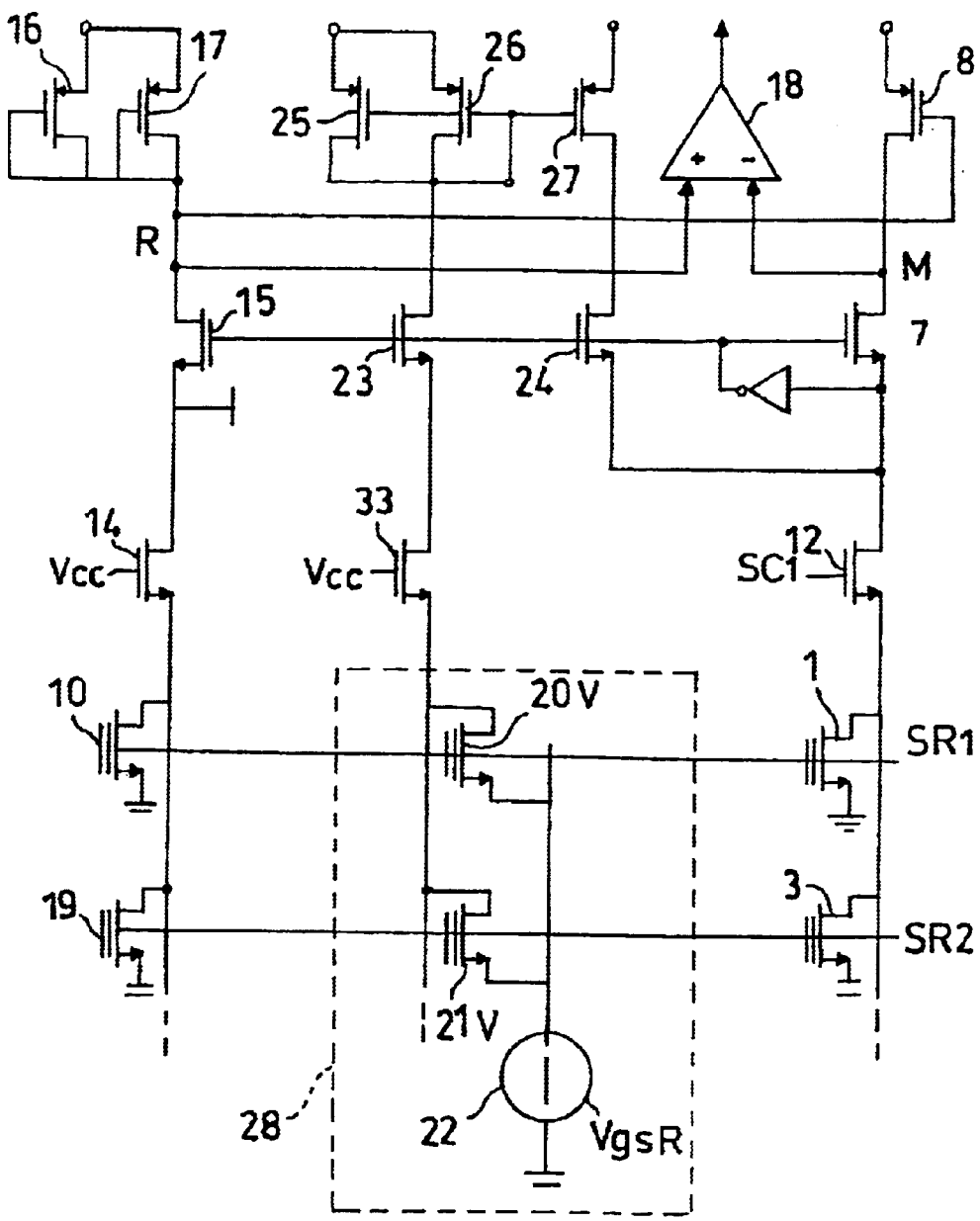
FIG. 10 shows the circuit diagram of a non-volatile memory with the unbalanced and rebalanced load differential reading system in accordance with a second embodiment of the present invention.

FIG. 10 shows a differential reading circuit in which, in conformity with the second of the rebalancing modes described above, the rebalancing is obtained by halving the current increments that occur in the load resistance 8 of the measuring line as Vgs varies (though without modifying the current flowing in the reference line).

This result is obtained by adding to the current that passes through the load resistor 8—as from a predetermined voltage VgsR onwards—a current equal to half the current increment in the measuring line corresponding to the voltage $\Delta V = Vgs - VgsR$.

In FIG. 10, once again, functional elements equivalent to those shown in FIG. 1 are identified by the same reference numbers.

The rebalancing circuit comprises a rebalancing line comprising a pair (25, 26) of parallel P-channel transistors/resistors with a diode connection between gate and drain to a series of elements comprising (in order) an N-channel protection transistor 23, a balancing transistor 33 and at least one floating-gate cell 20V in a neutral state or preferably in an embodiment, but not necessarily, a plurality (as many as the number of cells in a memory column) of floating-gate cells (like the cell 21V) connected in parallel therewith, with each cell biased by a corresponding selection signal SRi.

The cell 20V or the plurality of cells 20V, 21V has/have their source/s connected to a source 22 of the reference voltage VgsR.

The transistors 25 and 26—just as in the case of the transistors 16 and 17—are identical with the transistor 8 and, similarly, the transistors 23 and 33 are identical with, respectively, the transistors 7 and 12 and therefore balance the respective loads.

It is therefore evident that whenever the voltage of the selection signal SRi of a memory cell, the reference cell or the corresponding cell of the rebalancing circuit exceeds the voltage VgsR+Vgsv, the variation of the current flowing in the rebalancing circuit due to a variation of Vgs will be the same as the variation of the current in the measuring circuit caused by the same variation of Vgs, and this independently of whether the interrogated cell is virgin or programmed.

The rebalancing circuit comprises also a P-channel transistor 27 identical with the transistors 25, 26 and connected in mirror configuration with the transistor 26.

The drain of transistor 27 is connected to the measuring line via a protection transistor 24, the equivalent of transistor 7 of the measuring line, and then connected to ground via the particular memory cell (1, 3) that happens to be selected.

In this way, the current flowing in transistor 27 will be half the current flowing in the rebalancing circuit and this current will be necessarily be drained by the selected memory cell. This current will therefore be subtracted from the current flowing in transistor 8, so that the current increments in transistor 8 will be halved when Vgs>VgsR+Vgsv.

The response of the measuring circuit upon the interrogation of a cell therefore becomes as shown in FIG. 5.

Obviously, in this case the circuits of FIGS. 7 and 8 can again be used as the reference voltage generator 22.

It is also possible to replace the block 28 by the functionally equivalent circuit of FIG. 9, where the reference cells, rather than being in a neutral state, are in a modestly and appropriately programmed state.

Apart from offering the advantage of constructing a discrimination curve that at each point interpolates the characteristics of two cells that are identical but have different conductivities due to their different programming states, the proposed embodiment of the reference system also has several other advantageous properties.

Indeed, the position of the reference cell, which are constructively close to the matrix of memory cells with which they are compared, makes it possible to minimize the difference or dispersion of the conductivity characteristics of the cells concerned.

This means that the displacements with respect to reference of the cells to be programmed can be reduced to a minimum, i.e., it now becomes possible to program the cells with a minimal electric charge injected via the floating gate.

The aforesaid small displacement from reference proves fundamental for raising the number of cycles that can be sustained by non-volatile devices that are sensitive to the quantity of charges moved, as is the case of N-ROM cells.

The programming and cancellation activities also derive benefit from the reduced charging/discharging dynamics (because they will require less time).

The possibility of applying the same signal to both the reference cells and the matrix cells makes it possible to use differential reading procedures that are well known to be faster than the asymptotic ones, since readability conditions will now be produced almost as soon as the cells begin to conduct (because the selection signal switches in the same way for the comparison cell and the cell selected for measurement).

The flexibility with which the development of the reference characteristic can be regulated simplifies the implementation of the verification processes without there being any need for complex manipulations of the loads.

Many other variants can be introduced without overstepping the bounds of the invention: the described rebalancing systems refer to the case in which the initial unbalancing is produced in the ratio of 1:2.

It is however possible to use also other unbalancing ratios, for example, 1:3 or 2:3. In any case, no matter what the current contribution generated by the rebalancing circuit in relation to the effectively necessary contribution, it is well known that it can always be adjusted to this level by means of the so-called current mirror-circuits, of which the one used in FIG. 10 is but one example.

In particular, it is interesting to note that the differential reading system with load rebalancing here described with reference to non-volatile memories can be advantageously used also with other types of memories—such as dynamic memories or DRAMs—in which the cells are essentially constituted by a transistor, preferably an N-channel transistor, and a capacitance (capacitor) connected between the transistor source and ground, where the capacitor is charged or discharged according to the state to be memorized and is therefore equivalent to the programming state of the cell concerned (discharged for a virgin cell and charged for a programmed cell).

The state of charge of the capacitance determines the current response of the cell to the stimulation impressed by a selection signal (Vgs) substantially as in the case of non-volatile cells, with the sole difference that the current response is impulsive and transitory.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A memory with a differential reading system of a type in which a reference voltage, generated by a reference current that varies with a biasing voltage of at least one first reference cell in a virgin state, as a voltage drop across a first load resistor traversed by said reference current is compared with a measuring voltage, generated by a measuring current that varies with the same selection and biasing voltage of a read memory cell, as a voltage drop across a second load resistor traversed by said measuring current, a resistance of said first load resistor being a fraction of a resistance of said second load resistor, wherein said memory comprises circuit means that come into operation above a predetermined reference voltage to modify one of said reference and measuring currents, with equivalent effect on said load resistors, and to rebalance said reference and measuring currents above said predetermined reference voltage.

2. A memory in accordance with claim 1, wherein said circuit means modify said reference current with a current increment added to said reference current.

3. A memory in accordance with claim 2, wherein said current increment produced by a given increment of said biasing voltage is equal to a corresponding current increment in a virgin cell.

4. A memory in accordance with claim 3, wherein said circuit means comprise a generator of the predetermined reference voltage having a value comprised between a threshold voltage of a virgin cell and a threshold voltage of a programmed cell of said memory and at least one second reference cell in a neutral state and with its source connected to said reference voltage.

5. A memory in accordance with claim 2, wherein said circuit means comprise at least one second reference cell in a programmed state that has its drain connected to a drain of said first reference cell and its source connected to ground.

6. A memory in accordance with claim 4, wherein said reading system comprises a plurality of first reference cells, one for each row of memory cells, each selected with a corresponding memory row cell, and said circuit means comprise a plurality of second reference cells, one for each row of memory cells, each selected with a corresponding memory row cell.

7. A memory in accordance with claim 6, wherein one of said first reference cells, one of said second reference cells and said corresponding memory row cell are selected with the same selection signal.

8. A memory in accordance with claim 7, wherein said selection signal has the same dynamic transitory for all the simultaneously selected reference and memory cells.

9. A memory in accordance with claim 1, wherein said circuit means modify said measuring current by a current decrement subtracted from said measuring current.

10. A memory in accordance with claim 9, wherein said current decrement subtracted from said measuring current renders a characteristic of the residual measuring current corresponding to variations of said biasing voltage Vgs above said predetermined reference voltage parallel to a characteristic of the reference current.

11. A memory in accordance with claim 10, wherein said circuit means comprises a generator of the predetermined reference voltage having a value comprised between a threshold voltage of a virgin cell and a threshold voltage of a programmed cell of said memory, at least one second reference cell in a neutral state and with its source connected to said reference voltage and its drain connected to a supply voltage via selection transistors and a plurality of load resistors/transistors in parallel with each other and a current mirror associated with load transistors and connected by means of a selection transistor to said read memory cell to subtract from said measuring current a current equal to a fraction of the current absorbed by said second reference cell.

12. A memory in accordance with claim 8, wherein said circuit means comprise at least one second reference cell in a programmed state that has its source connected to ground and its drain connected to a supply voltage via selection transistors and a plurality of load transistors/resistors and a current mirror associated with said load transistors and connected to said memory cell to subtract from said measuring current a current equal to a fraction of the current absorbed by said second reference cell.

13. A memory in accordance with claim 7, wherein said reading system comprises a plurality of first reference cells, one for each row of memory cells, each selected with a corresponding memory row cell, and said circuit means comprise a plurality of second reference cells, one for each row of memory cells, each selected with a corresponding memory row cell.

14. A memory in accordance with claim 13, wherein one of said first reference cells, one of said second reference cells and said corresponding memory row cell are selected with the same selection signal.

15. A memory in accordance with claim 14, wherein said selection signal has the same dynamic transitory for all the selected cells.

16. A memory in accordance with claim 1, wherein said memory cell and said first reference cell are non-volatile floating-gate cells.

17. A memory in accordance with claim 1, wherein said memory cell and said first reference cell are dynamic cells.

18. A memory in accordance with claim 4, wherein said predetermined reference voltage can be modified.

19. A memory in accordance with claim 4, wherein said generator is such as to generate a first voltage to which there corresponds a first behavior of the reference current to be employed for reading a memory cell.

20. A memory in accordance with claim 19, wherein said generator is also such as to selectively generate a second voltage to which there corresponds a second behavior of the reference current to be employed for reading said cell as part of a programming operation of the cell, said second voltage having a value smaller than the value of said first voltage.

21. A memory in accordance with claim 20, wherein said generator is also such as to selectively generate a third voltage to which there corresponds yet another behavior of the reference current to be employed for reading said cell as part of a cancellation operation, said third voltage having a value greater than the value of said first voltage.

22. A memory in accordance with claim 21, wherein said generator is provided with control signal input terminals such as to make possible selection of one of said first, second or third voltage.

23. A memory in accordance with claim 21, wherein signals employed for selecting memory cells differ according to whether a reading of the cells is intended to read cell content or forms part of an operation for checking whether programming or cancellation of the cell has been completed.

24. A memory in accordance with claim 22, wherein said voltage generator comprises a resistive voltage divider and a selection circuit connected to said input terminals.

25. A memory in accordance with claim 24, further comprising a voltage regulator connected to said generator and said source of said second reference to stabilize voltage generated by the generator.

* * * * *